United States Patent [19]

Takatani et al.

[11] Patent Number: 5,025,751
[45] Date of Patent: Jun. 25, 1991

[54] SOLID FILM GROWTH APPARATUS

[75] Inventors: Shinichiro Takatani; Shigeo Goto, both of Kokubunji; Masahiko Kawata, Hachioji; Kenji Hiruma, Koganei, all of Japan

[73] Assignee: Hitachi, Ltd., Tokyo, Japan

[21] Appl. No.: 366,185

[22] Filed: Jun. 14, 1989

Related U.S. Application Data

[63] Continuation-in-part of Ser. No. 153,002, Feb. 8, 1988, abandoned.

[51] Int. Cl.$^5$ .............................................. C23C 16/00
[52] U.S. Cl. ..................................... 118/733; 118/719; 118/726; 148/DIG. 169; 156/611; 156/613; 156/DIG. 103; 427/255.2
[58] Field of Search ............... 118/715, 719, 726, 733; 156/611, 613, DIG. 103; 204/298; 148/DIG. 169; 427/255.2

[56] References Cited

U.S. PATENT DOCUMENTS

| 3,531,335 | 9/1970 | Heyerdahl et al. | 148/DIG. 169 |
| 3,839,084 | 10/1974 | Cho et al. | 156/611 |
| 4,636,268 | 1/1987 | Tsang | 156/613 |
| 4,640,720 | 2/1987 | Foxon | 118/726 |
| 4,699,085 | 10/1987 | Purdes | 118/725 |

FOREIGN PATENT DOCUMENTS

| 60-244018 | 12/1985 | Japan | 118/726 |
| 62-57211 | 3/1987 | Japan | 118/726 |
| 62-237719 | 10/1987 | Japan | 118/726 |
| 62-237720 | 10/1987 | Japan | 118/726 |

OTHER PUBLICATIONS

Tsang, W. T., Applied Physics Letters, vol. 45, No. 11 (1984), pp. 1234–1236.
Hirayama, H. et al., "Gas Source Silicon Molecular Beam Epitaxy Using Silane", Applied Physics Letters, vol. 51, No. 26 (Dec. 28, 1987), pp. 2213–2215.
Panish, M. B., "Molecular Beam Epitaxy of GaAs and InP with Gas Sources for As and P", Journal of the Electrochemical Society: Solid State Science and Technology (Dec. 1980), pp. 2709–2733.

Primary Examiner—Norman Morgenstern
Assistant Examiner—Terry J. Owens
Attorney, Agent, or Firm—Antonelli, Terry, Stout & Kraus

[57] ABSTRACT

A solid film forming apparatus, e.g., an MO-MBE (Metal-Organic Molecular Beam Epitaxy) apparatus, wherein evacuatable containers isolated from a growth chamber by a switching device and connected to raw material gas introduction pipings are provided between the growth chamber for a solid film, e.g., a compound semiconductor, and raw material gas introduction pipings. Growth of the solid film is controlled by opening and closing the switching device and evacuating the container at least while the switching device is closed during the growth of the solid film. An undesired influence on the growing film due to residual gas in the containers which are not used for growth can be prevented and, hence, interception and introduction of the raw material gas into the growth chamber can be performed with remarkably high controllability, and films of superior abruptness of the interface between films, e.g., the heterojunction of the compound semiconductor, can be obtained.

26 Claims, 2 Drawing Sheets

SOLID FILM GROWTH APPARATUS

This application is a continuation-in-part of application Ser. No. 07/153,002, filed Feb. 8, 1988, now abandoned.

BACKGROUND OF THE INVENTION

The present invention relates to a solid film growth apparatus and a growth method and, more particularly, it relates to a semiconductor, e.g., compound semiconductor, growth apparatus and growth method suitable for formation of an abrupt heterojunction with good reproducibility and mass-productivity.

Recently, electronic devices or optical devices having films with abrupt interfaces, e.g., devices utilizing a heterojunction of compound semiconductors such as gallium arsenide (GaAs)/aluminum gallium arsenide (AlGaAs) and the like have been rapidly developed. Many of these devices require formation of a heterojunction having abruptness of nearly a monolayer. Of the compound semiconductor growth methods which meet this requirement, there has been known the molecular beam epitaxy (MBE) method (See, for example, Kiyoshi Takahashi, "Molecular Beam Epitaxy Technique," published from Kogyo Chosa Kai, 1984.) An outline of an MBE apparatus is shown in FIG. 2 In growth chamber 1 which can be drawn to high vacuum of less than $10^{-9}$ Torr are provided MBE cells 2 charged with solid sources. A molecular beam is emitted by heating these MBE cells 2 Since the inside of growth chamber 1 is under high vacuum which satisfies molecular flow conditions, molecules emitted from MBE cells 2 go straight without colliding against other molecules and reach substrate 3. The molecular beam can be intercepted by closing shutters 4 placed in front of the MBE cells. Formation of the GaAs/AlGaAs heterojunction will be explained as one example. The shutter of the MBE cell charged with aluminum (Al) is opened and closed When the shutter 4 is closed, the Al molecular beam sticks to said shutter, liquid-nitrogen-cooled shroud 5 or the inner wall of a vacuum apparatus and hence, the beam does not reach substrate 3. Therefore, the abruptness of the GaAs/AlGaAs junction is determined closely by growth rate and opening and closing speed of the shutters and thus, the abruptness on a monolayer order can be easily realized under normal conditions. This MBE method requires a process of replenishment of solid sources in the growth chamber and because conditions for the production of the molecular beam readily change before and after this replenishment, this method suffers from problems in mass-productivity and reproducibility.

A growth method which uses organometallic gases in place of solid sources as raw materials has been proposed and this method is known as a metal-organic molecular beam epitaxy (MO-MBE) method or chemical beam epitaxy (CBE) method. (See, for example W. T Tsang, *Applied Physics Letters*, Vol 45, No. 11, 1984, pp. 1234–1236.) An outline of this MO-MBE method is shown in FIG. 3.

Growth of GaAs/AlGaAs will be explained as one example. Through gas introduction pipings 13 are introduced arsine (AsH 3) or the like as a source for arsenic, trimethyl gallium (TMG), triethyl gallium (TEG) or the like as a source for gallium and triethyl aluminum (TEA) or the like as a source for aluminum. Sometimes, each gas is subjected to cracking by cracking cell 15 for activating the gas to make the growth of compound semiconductors easier. Flow rates of each gas can be controlled by mass flow controller 7 and furthermore, valves 8 are provided which are capable of stopping flow of gas into the growth chamber. A GaAs/AlGaAs junction is formed by first introducing gases which are sources for arsenic, gallium and aluminum and then closing valves 8 of the pipings for introduction of the source for aluminum or closing shutters 4.

The above MO-MBE method has the disadvantages that even after valves 8 have been closed, gas remaining in the pipings which connect the valves and growth chamber 1 continues to flow into growth chamber 1 and further that after opening the valve and while pressure in gas introduction pipings 13 becomes stable, flow rate is apt to change and thus it is difficult to form a junction having abruptness similar to that of a junction formed by an MBE pocedure. Moreover, when shutters 4 are closed, since the raw material is an organometallic gas, it does not adhere well to a shutter surface and the gas molecule is reflected at the shutter and the inner wall of the growth chamber and reaches the substrate. Thus, it is difficult to obtain an abrupt junction by the opening and closing procedure of the shutter.

SUMMARY OF THE INVENTION

The object of the present invention is to provide a novel solid film growth apparatus and a growth method free of the conventional problems mentioned above.

The above object can be attained by modification of the conventional MO-MBE apparatus of FIG. 3 as follows: That is, as shown in FIG. 1, at least one gas introduction chamber 9 (second container) is provided between the piping for introduction of a raw material gas and growth chamber 1 (first container) together with switching device 10 capable of isolating the gas in the gas introduction chamber 9 from that in growth chamber 1. Also, at least one evacuation facility is provided such as evacuation facilities 12 and 16 for growth chamber 1 and the gas introduction chamber, respectively. The at least one evacuation facility 16 for gas introduction chamber 9 can evacuate the gas introduction chambers during growth of the solid film and at least during the time when switching devices 10 are closed. Thus, the object of the present invention is attained. Ultimate pressure in the evacuation system for the gas introduction chamber is preferably such that the degree of ultimate vacuum is higher than $1 \times 10^{-8}$ Torr. The inside of the growth chamber must be highly evacuated to satisfy the molecular flow conditions.

Evacuation facilities may be provided for each of the first container and the second container or a single evacuation facility may be common to all the containers.

The solid film grown may be, e.g., a metal, an insulative film, an elemental semiconductor film or a compound semiconductor film.

The source gas may also be used in combination with a source in a solid state.

DETAILED DESCRIPTION OF THE PREFERRED EMBODIMENTS

Figure 1:
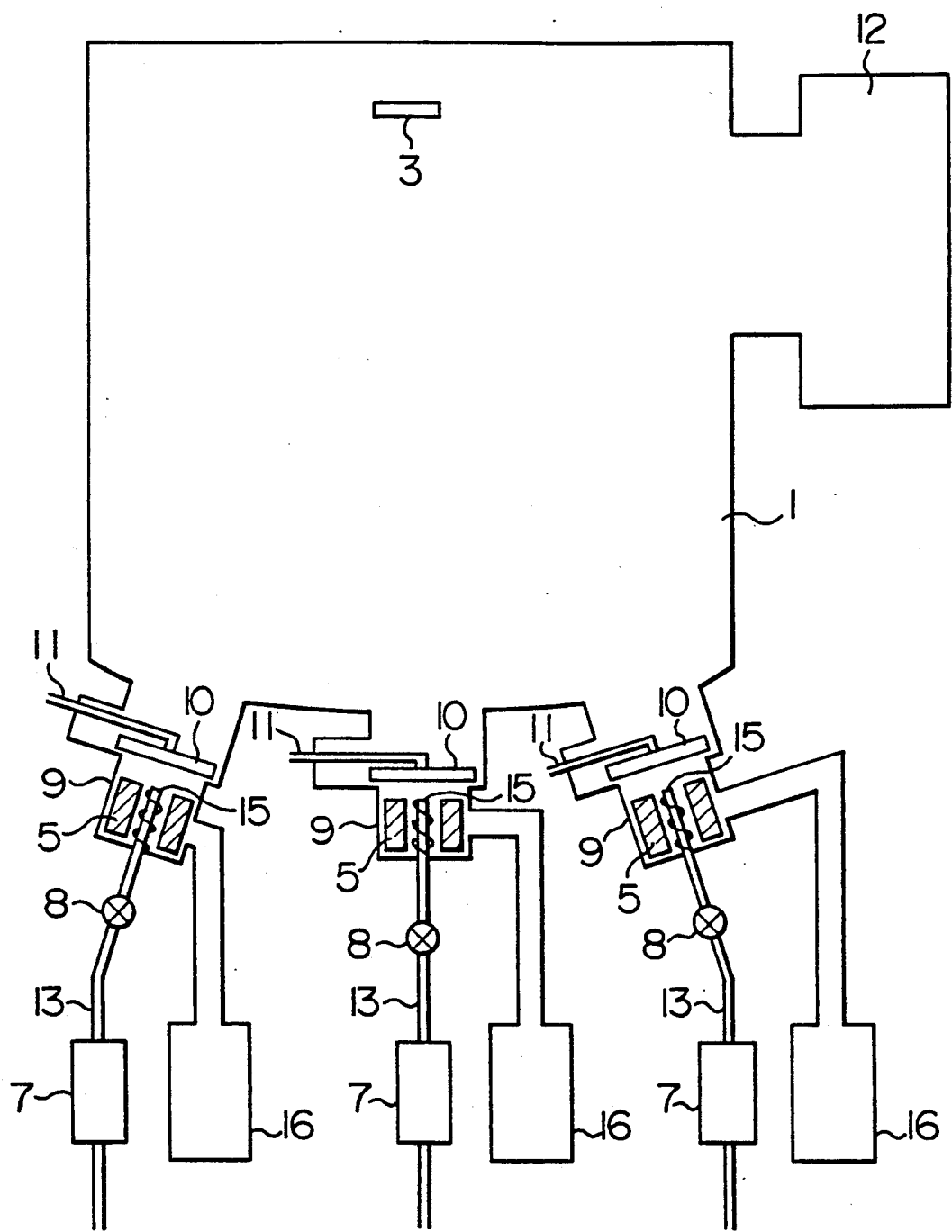
FIG. 1 is a sectional view of one example of the compound semiconductor growth apparatus of the present invention.
Figure 2:
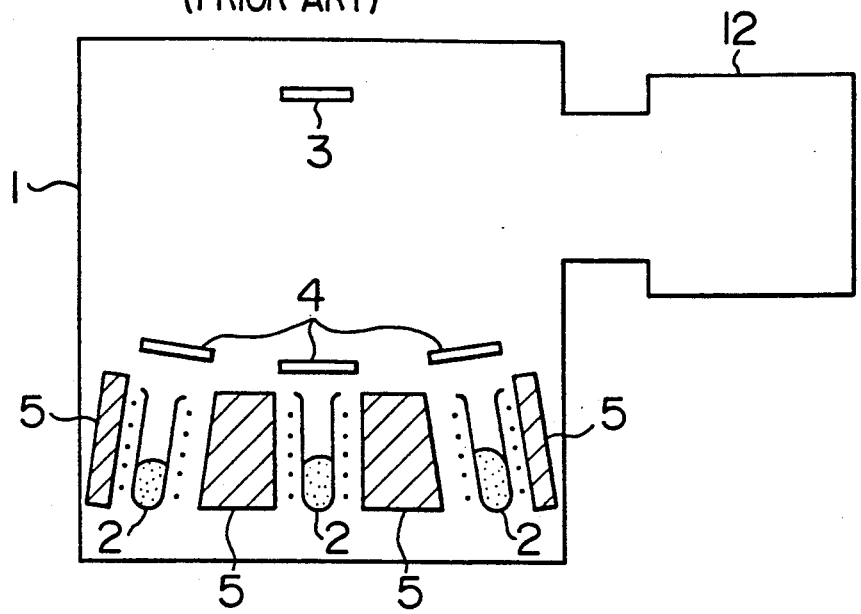
FIG. 2 is a sectional view of a conventional MBE apparatus.
Figure 3:
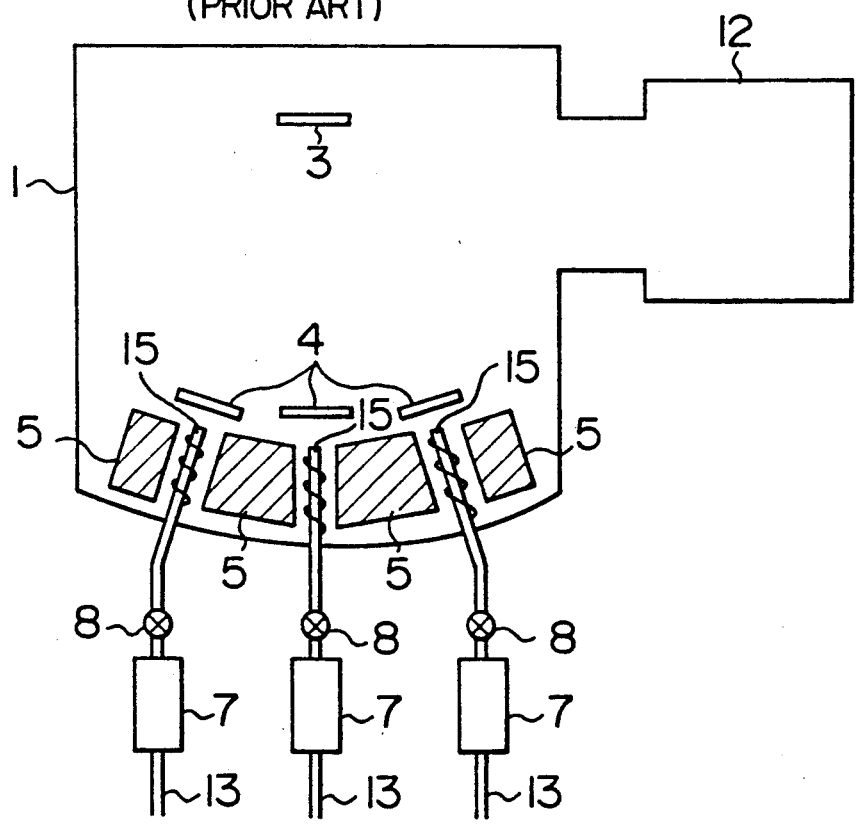
FIG. 3 is a sectional view of a conventional MO-MBE apparatus.

In the solid film growth apparatus of the present invention as shown in FIG. 1, introduction and interception of raw material gas are carried out by opening and closing operations of switching devices 10. Gas introduction chambers 9 can be evacuated by evacuation facilities 16 during growth of the compound semiconductor and at least during the time the switching devices are being closed. When switching devices 10 are closed, raw material gases are completely intercepted and not introduced into growth chamber 1. In this case, the entire raw material gases flowing into gas introduction chambers 9 are evacuated by evacuation facilities 16. When switching devices 10 are opened, raw material gas molecules go straight in growth chamber 1 and reach substrate 3. In this case, since gas introduction chambers 9 are evacuated by evacuation facilities 16 at least until just before opening of the switching devices, flow of residual gas in gases introduction chambers 9 into growth chamber 1 when switching devices 10 are opened can be ignored. Thus, the introduction of the raw material gases into the growth chamber and interception of the gas can be performed under much better controllability as compared with the conventional MO-MBE method and it becomes possible to form a solid film, e.g., a compound semiconductor heterojunction, having an extremely abrupt interface similar to that obtained by the conventional MBE method. Furthermore, since gas is employed as a raw material, the process for replenishment of raw material as in the MBE method is not necessary and the growth method of the present invention is also superior in mass-productivity and reproducibility. Any devices can be employed as switching devices 10 as far as they can intercept raw material gases and usually, a device called a gate valve or the like is used. It is necessary that gas introduction chambers 9 can be evacuated at least during switching devices 10 being closed, but it may be evacuated throughout the growth of the compound semiconductor.

In one example of the present invention, formation of an AlGaAs/GaAs/AlGaAs heterojunction will be explained with reference to FIG. 1. However, the invention is also applicable to growth of any solid film, e.g., an elemental, e.g., silicon semiconductor film, a metal film or an insulative film.

As raw material gases, $AsH_3$, trimethyl gallium (TMG) and triethyl aluminum (TEA) are respectively introduced into gas introduction chambers 9 from raw material gas introduction pipings 13. In this case, all switching devices are opened. $AsH_3$ is cracked by cracking cells 15. Temperature of substrate 3 is about 560° C. Under this condition, AlGaAs grows on substrate 3 At this point, when switching device 10 of the gas introduction chamber which introduces TEA is closed, GaAs begins to grow on the substrate. When the switching device 10 is again opened, AlGaAs grows on substrate 3 to obtain the desired AlGaAs/GaAs/AlGaAs junction.

In the above procedure, when the flow rate Q of TMA is $5 \times 10^{-3}$ Torr·sec$^{-1}$ and evacuation speed S of evacuation facility 16 at ultimate pressure of $1 \times 10^{-8}$ Torr or less is 500·sec$^{-1}$, degree of vacuum p in gas introduction chamber 9 under the condition of the TMA switching device being closed is sufficiently high, i.e., $$p = Q/S = 10^{-5} \text{ Torr.}$$

Therefore, when switching device 10 is opened again, introduction of residual gas in gas introduction chamber 9 into growth chamber 1 has substantially no effect on the growth. It has been confirmed by a photoluminescence method that abruptness of the thus obtained AlGaAs/GaAs interface and GaAs/AlGaAs interface are of about two monolayers.

In this example, the evacuation facility for the growth chamber and that for the gas introduction chamber are separately provided, but these may be common to both chambers as stated before.

As mentioned previously, the present invention can also be used to grow other solid films. For example, a silicon semiconductor film can be grown according to the present invention using, e.g., $SiH_4$ as a gas source. A gas source Si MBE apparatus is disclosed in H. Hirayama et al, "Gas source silicon molecular beam epitaxy using silane," in *Applied Physics Letters*. Vol. 51, No. 26, 28 Dec. 1987, pages 2213–2215, the contents of which are incorporated herein by reference. In this apparatus, a subchamber is used to control the flow rate of the $SiH_4$ gas source by changing the subchamber pressure.

A gas source in combination with a solid source may also be used. For example, a GaAs film can be grown according to the present invention using a gas source such as $AsH_3$ in combination with a source of Ga in a solid state. Similarly, an InP film can be grown according to the present invention using a gas source such as $PH_3$ in combination with an In source in a solid state. Use of such gas sources in combination with a source in a solid state is disclosed in M. B. Panish, "Molecular Beam Epitaxy of GaAs and InP with Gas Sources for As and P," in *Journal of the Electrochemical Society: Solid State Science and Technology*, Dec. 1980, pages 2709–2733, the contents of which are incorporated herein by reference.

According to the present invention, interception and introduction of raw material gases into the growth chamber can be performed with high controllability and hence, abrupt interfaces such as a compound semiconductor heterojunction having abruptness comparable to that formed by the compound semiconductor growth method using solid sources, namely, so-called MBE method can be obtained. Besides, since gaseous raw materials are used, the process for replenishment of raw materials as required in the MBE method is unnecessary in the present invention and thus, the present method is also superior in mass-productivity and reproducibility.

What is claimed is:

1. A compound semiconductor growth apparatus for growth of a compound semiconductor using an organo-metallic gas as a raw material gas in a vacuum satisfying molecular flow conditions, comprising: a first container for growth of the compound semiconductor, switching devices for controlling introduction of the raw material gas, second containers isolated from the gas in said first container by said switching devices, raw material gas-introduction pipings connected to said second containers, and at least one evacuation facility for evacuation of and separately and directly connected to each of said first container and second containers.

2. A compound semiconductor growth apparatus according to claim 1, wherein the evacuation facility can evacuate the second containers throughout the growth of the compound semiconductor.

3. A compound semiconductor growth apparatus according to claim 1, wherein the evacuation facility which evacuates the second containers provides a degree of ultimate vacuum higher than $1 \times 10^{-8}$ Torr.

4. A compound semiconductor growth apparatus according to claim 1, wherein a plurality of evacuation facilities are provided and separate evacuation facilities are connected to each of said first container and said second containers.

5. A compound semiconductor growth apparatus according to claim 1, wherein said switching devices are located so as to enable said raw material gas to be completely intercepted and not introduced into said first container, and wherein said raw material gases may be evacuated from said second container by said at least one evacuation facility.

6. A metal-organic beam epitaxy apparatus for growing a compound semiconductor using at least one organometallic gas as a raw gas, comprising:
a first chamber for growth of the compound semiconductor, which can be evacuated to satisfy molecular flow conditions;
at least one second chamber having an opening which opens into the first chamber;
switching means provided at the opening of each second chamber, for isolating the at least one second chamber from the first chamber, and for controlling the introduction of the raw material gas from the at least one second chamber to the first chamber;
raw material gas introducing pipings connected to each second chamber; and
at least one evacuation means for evacuating and being separately and directly connected to each of the first chamber and the at least one second chamber.

7. An apparatus according to claim 6, wherein a separate evacuation means is connected to the first chamber and each second chamber.

8. An apparatus according to claim 6, wherein the evacuation means can evacuate the at least one second chamber throughout the growth of the compound semiconductor.

9. An apparatus according to claim 6, wherein the evacuation means for the at least one second chamber provides a degree of ultimate vacuum higher than $1 \times 10^{-8}$ Torr.

10. An apparats according to claim 6, wherein the switching means are gate valves.

11. An apparatus according to claim 6, further including cracking cells in contact with the gas introduction pipings to enable cracking of the raw material gases.

12. An apparatus according to claim 6, wherein the evacuation means evacuates the first chamber and the at least one second chamber simultaneously.

13. An apparatus according to claim 6, wherein the evacuation means evacuates the at least one second chamber when the at least one second chamber is isolated from the first chamber by the switching means provided at the opening of each second chamber, while molecular flow conditions are maintained in the first chamber.

14. An apparatus according to claim 6, wherein said switching means are located such that said raw material gas may be completely intercepted and not introduced into said first chamber, and wherein said at least one evacuation means can evacuate all of the raw material gas flowing into said second chamber.

15. A compound semiconductor growth apparatus for growth of a compound semiconductor using at least one raw material gas in a vacuum satisfying molecular flow conditions, comprising: a first container for growth of the compound semiconductor, at least one switching device for controlling introduction of the raw material gas, at least one second container isolated from the gas in said first container by said switching device, at least one raw material gas-introduction piping connected to said second container, and at least one evacuation facility for evacuation of and separately and directly connected to each of said first container and said at least one second container.

16. A compound semiconductor growth apparatus according to claim 15, wherein the evacuation facility can evacuate the at least one second container throughout the growth of the compound semiconductor.

17. A compound semiconductor growth apparatus according to claim 15, wherein a plurality of evacuation facilities are provided and separate evacuation facilities are connected to each of the first container and the at least one second container.

18. A compound semiconductor growth apparatus according to claim 15, wherein said switching devices are located so as the enable said raw material gas to be completely intercepted and not introduced into said first container, and wherein said raw material gases may be evacuated from said at least one second container by said at least one evacuation facility.

19. A semiconductor growth apparatus for growth of a semiconductor using at least one raw material gas in a vacuum satisfying molecular flow conditions, comprising: a first container for growth of the compound semiconductor, at least one switching device for controlling introduction of the raw material gas, at least one second container isolated from the gas in said first container by said switching device, at least one raw material gas-introduction piping connected to said second container, and at least one evacuation facility for evacuation of and separately and directly connected to each of said first container and said at least one second container.

20. A semiconductor growth apparatus according to claim 19, wherein the evacuation facility can evacuate the at least one second container throughout the growth of the semiconductor.

21. A semiconductor growth apparatus according to claim 19, wherein a plurality of evacuation facilities are provided and wherein separate evacuation facilities are connected to each of said first container and said at least one second container.

22. A semiconductor growth apparatus according to claim 19, wherein said switching devices are located so as to enable said raw material gas to be completely intercepted and not introduced into said first container, and wherein said raw material gases may be evacuated from said at least one second container by said at least one evacuation facility.

23. A solid film forming apparatus for growth of a solid film using at least one raw material gas in a vacuum satisfying molecular flow conditions, comprising: a first container for growth of the solid film, at least one switching device for controlling introduction of the raw material gas, at least one second container isolated from the gas in said first container by said switching device, at least one raw material gas-introduction piping connected to said second container, and at least one evacuation facility for evacuation of and separately and directly connected to each of said first container and said at least one second container.

24. A solid film forming apparatus according to claim 23, wherein the evacuation facility can evacuate the at least one second container throughout the growth of the solid film.

25. A solid film forming apparatus according to claim 23, wherein a plurality of evacuation facilities are provided and separate evacuation facilities are connected to each of said first container and said at least one second container.

26. A solid film forming apparatus according to claim 23, wherein said switching devices are located so as to enable said raw material gas to be completely intercepted and not introduced into said first container, and wherein said raw material gases may be evacuated from said at least one second container by said at least one evacuation facility.

* * * * *